United States Patent
Van Brocklin et al.

(10) Patent No.: US 6,167,955 B1
(45) Date of Patent: Jan. 2, 2001

(54) MULTI-MODE HEAT TRANSFER USING A THERMAL HEAT PIPE VALVE

(75) Inventors: Andrew L. Van Brocklin, Corvallis; James F. Bausch, Salem; John R. Sterner, Albany, all of OR (US)

(73) Assignee: Hewlett-Packard Company, Palo Alto, CA (US)

(*) Notice: Under 35 U.S.C. 154(b), the term of this patent shall be extended for 0 days.

(21) Appl. No.: 09/427,511

(22) Filed: Oct. 26, 1999

Related U.S. Application Data

(63) Continuation of application No. 09/128,398, filed on Aug. 3, 1998, now Pat. No. 6,047,766.

(51) Int. Cl.[7] ............................................. F28F 27/00
(52) U.S. Cl. ............. 165/272; 165/104.26; 165/104.22; 165/104.23; 165/104.25
(58) Field of Search ............................ 165/272, 104.26, 165/104.29, 104.14, 104.19, 104.22, 104.21; 174/15.2; 257/715, 720; 361/700, 707

(56) References Cited

U.S. PATENT DOCUMENTS

| | | | |
|---|---|---|---|
| 3,602,429 | 8/1971 | Levedahl et al. | 237/9 |
| 3,605,878 * | 9/1971 | Coleman | 165/104.26 |
| 3,621,906 * | 11/1971 | Leffert | 165/104.26 |
| 4,082,109 | 4/1978 | Sun et al. | 137/340 |
| 4,437,510 | 3/1984 | Martorana | 165/32 |
| 4,617,985 * | 10/1986 | Triggs et al. | 165/47 |
| 4,635,709 | 1/1987 | Altoz | 165/32 |
| 4,693,306 | 9/1987 | Nilson | 165/104.21 |
| 4,921,041 * | 5/1990 | Akachi | 165/104.14 |
| 4,941,526 | 7/1990 | Nilsson | 165/32 |
| 4,974,667 | 12/1990 | Sun et al. | 165/41 |
| 4,986,348 * | 1/1991 | Okayasu | 165/104.24 |
| 5,190,539 * | 3/1993 | Fletcher et al. | 165/104.26 |
| 5,211,371 | 5/1993 | Coffee | 251/11 |
| 5,241,950 | 9/1993 | Mahdjuri-Sabet | 126/589 |
| 5,285,347 | 2/1994 | Fox et al. | 361/385 |
| 5,394,936 | 3/1995 | Budelman | 165/104.33 |
| 5,394,969 | 3/1995 | Harbaugh | 194/206 |
| 5,417,686 * | 5/1995 | Peterson et al. | 606/25 |
| 5,441,102 | 8/1995 | Burward-Hoy | 165/104.25 |
| 5,504,924 | 4/1996 | Ohashi et al. | 375/800 |
| 5,591,162 * | 1/1997 | Fletcher et al. | 606/25 |
| 5,771,967 | 6/1998 | Hyman | 165/274 |

* cited by examiner

*Primary Examiner*—Ira S. Lazarus
*Assistant Examiner*—Terrell McKinnon
(74) *Attorney, Agent, or Firm*—Timothy F. Myers

(57) ABSTRACT

An electronic device has a heat pipe containing a heat transfer fluid. The heat pipe has a first section and a second section. Inside the heat pipe is a valve disposed between the first section and second section of the heat pipe. The valve has an actuator that is used to regulate the flow of the heat transfer fluid between the first section and the second section of the heat pipe in response to a changed state detected by a sensor.

8 Claims, 8 Drawing Sheets

MULTI-MODE HEAT TRANSFER USING A THERMAL HEAT PIPE VALVE

CROSS REFERENCE TO RELATED APPLICATION(S)

This is a continuation of application Ser. No. 09/128,398 filed on Aug. 3, 1998, now U.S. Pat. No. 6,047,766.

FIELD OF THE INVENTION

This invention relates to a heat transfer system. More specifically, it relates to a multi-mode heat transfer system having a valve disposed between two sections of a heat pipe for use in electronic devices.

BACKGROUND OF THE INVENTION

The trend in the design of electronic devices, such as notebook computers or personal data assistants, is to provide as small a package as functionally possible while at the same time providing for comfortable cool and lightweight operation. Additionally, market forces also require that electronic devices, such as notebook computers, deliver the same computational horsepower as their desktop equivalents in order to justify their cost. However, to achieve this faster performance, integrated circuits (ICs), especially the central processing unit (CPU), the graphics controller, and the memory devices all require more power, which create more heat in the device. The combination of this additional heat and a smaller package creates additional stress on the internal components, causing the electronic devices to quit working or literally become too hot to handle.

Another problem, especially with notebooks, is that peripheral modules such as floppy, CD-ROM, Zip and DVD drives and PC cards not only take up space, they create more heat. Also, many of these peripheral modules are sensitive to heat generated from the other components in the electronic device and may prematurely fail to operate if these temperature sensitive modules become too hot.

Several different techniques have been developed to deal with the excess heat generated in an electronic device. By slowing the CPU clock rate down, the heat generated by the CPU decreases; however, the user's desire for desktop performance can not be met. By creating a docking station to hold various peripherals that are not used when the electronic device is mobile, more space becomes available in the electronic device for additional heat transfer structures. However, the electronic device in a docking environment usually causes the user to change their expectations of use such that the user wants full performance with an external monitor and keyboard as well as access to a network such as the Internet. In this situation, usually the electronic device's cover or lid is closed, or the electronic device is enclosed by the docking station, and in both cases the heat transfer properties of the electronic device change. What is required for future electronic devices is an optimal way to keep them cool in whatever operating mode the user decides to use.

SUMMARY OF THE DISCLOSURE

An electronic device has a heat pipe containing a heat transfer fluid. The heat pipe has a first section and a second section. Inside the heat pipe is a valve disposed between the first section and second section of the heat pipe. The valve has an actuator that is used to regulate the flow of the heat transfer fluid between the first section and the second section of the heat pipe in response to a changed state detected by a sensor.

DETAILED DESCRIPTION OF THE PREFERRED AND ALTERNATIVE EMBODIMENTS

Figure 1:
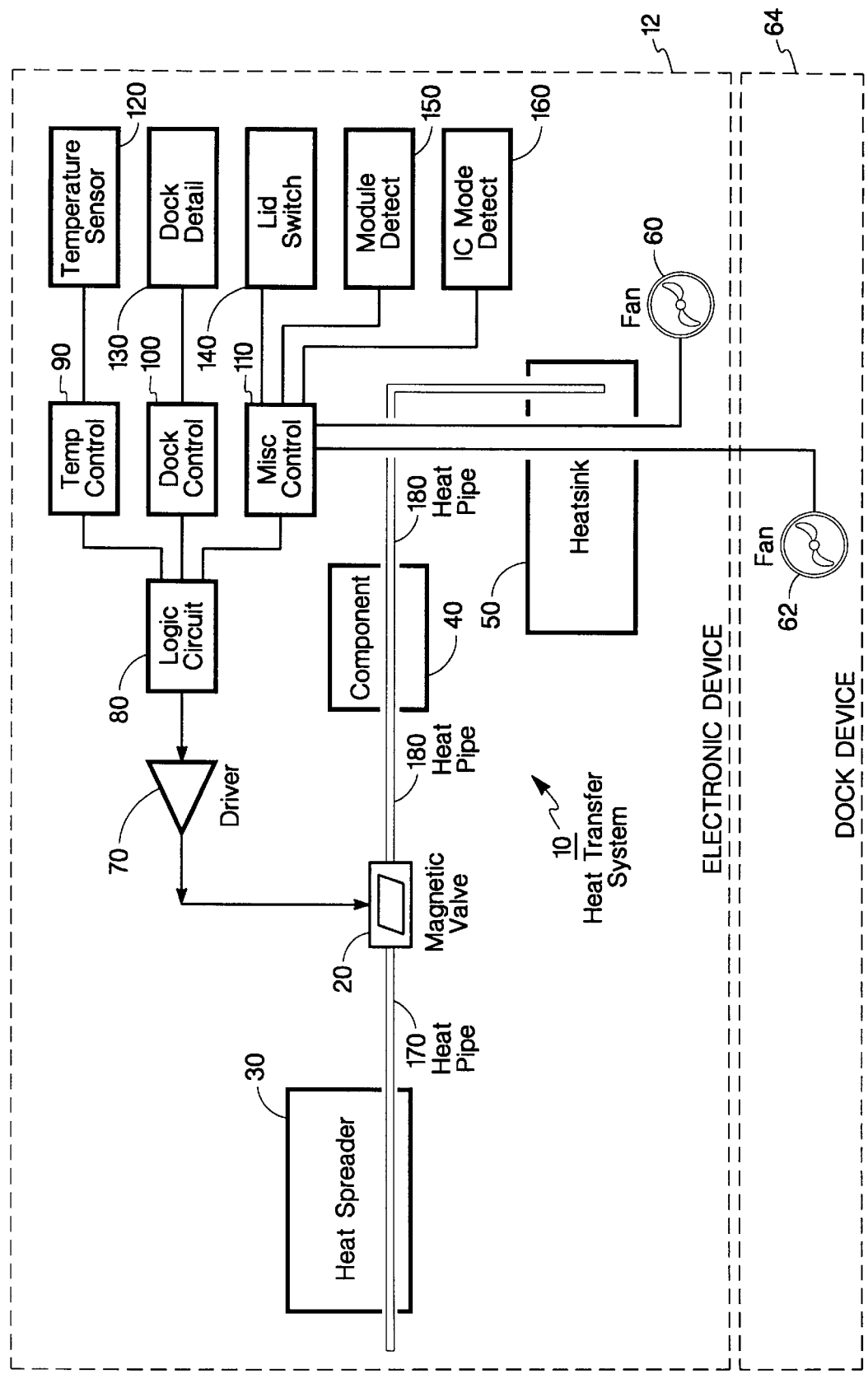
FIG. 1 is a schematic illustration of a heat transfer system for an electronic device.

FIG. 1 is a schematic illustration of a heat transfer system 10 for an electronic device 12, such as a notebook computer or personal data assistant (PDA), comprised of at least one heat producing component 40 which is attached to a second heat pipe section 180 which carries heat from the component 40 to a heat sink area 50. A heat pipe is a passive hermetically sealed closed container which contains a wick or other capillary structure, contained within the inner walls of the container, soaked with a small amount of vaporizable fluid, preferably water or another liquid that has been depressurized to reduce the boiling point of the fluid to a temperature less than the maximum operating temperature of the heat producing component 40, i.e. 90° C. Unless specifically called out, the term fluid used in this specification encompasses the fluid within the heat pipe in either a liquid or vapor state. In the preferred embodiment, the heat producing component 40 applies heat to one end of the heat pipe causing the water or other liquid to vaporize (boil) and thus absorb energy, then this vapor travels to the cool end of the heat pipe and condenses. In the process of condensation, the fluid releases the heat (the energy previously absorbed) to the exterior of the heat pipe. The fluid returns to the warm portion of the pipe via the wick or other capillary structure and the process is repeated. As the vapor pressure drop between the evaporator and condenser is very small, the heat pipe maintains an essentially constant temperature along the length of the heat pipe. With the proper design, the heat pipe can transfer large amounts of heat without temperature losses.

Heat sink area 50 is designed to radiate heat freely into the air away from the electronic device 12. Optionally, to improve the rate of heat transfer, a fan 60 may be combined with heat sink area 50. The fan 60 is controlled by logic circuit 80 to operate depending on the states of several factors, as will be discussed in more detail later. Exemplary factors are: sensing when the component 40 is too hot; sensing that ambient air inside the electronic device 12 is too hot; sensing that the electronic device 12 is being used in different modes (such as docking); sensing that the lid of the electronic device 12 has been closed; sensing that a new temperature sensitive module has been inserted into the electronic device 12; and detecting that a component, such as an integrated circuit (IC), has changed to a new mode of operation (i.e., a CPU speedup or a change of the graphic controller display mode). Those skilled in the art will appreciate that other states that affect the thermal performance of the electronic device 12 could be used to provide input to logic circuit 80 and still fall with the spirit and scope of the invention.

There may be times during operation of the electronic device 12, such as in a notebook computer, when nominal heat dissipation is required and fan operation is not desired due to the noise created or the power consumed by the fan. In these instances, a heat spreader 30 is coupled to component 40 through a first heat pipe section 170 and is placed under the keyboard, palmrest or other exposed surface area to allow heat to be released out of the electronic device 12. However, this heat spreader 30 often spreads heat to temperature sensitive modules or other peripheral devices, which may affect their performance. In addition, when the lid or cover is closed over the exposed surface area, it may be necessary for the heat spreader 30 to stop functioning, as the heat it is dissipating cannot leave the electronic device 12 and the excess heat builds up inside the electronic device 12 causing the temperature sensitive modules to fail. Thus, the heat spreader 30 restricts the temperature that the heat producing component 40 can operate. If the heat spreader 30 can be disconnected from the heat sink area 50 and fan 60 circuit, the heat producing component 40 can be operated at higher temperatures that are within its specification without affecting the components near the heat spreader 30.

The invention addresses this problem by creating a magnetic valve 20, which is disposed between the second heat pipe section 180, and the first heat pipe section 170. The second heat pipe section 180 is further coupled to component 40 and heat sink area 50 and first heat pipe section 170 is further coupled to heat spreader 30. This magnetic valve 20 is electronically controlled by a driver 70 that is driven by a logic circuit 80 which combines a number of decision variables from temperature control circuit 90, dock control circuit 100, and miscellaneous control circuit 110. Temperature sensor(s) 120 provide temperature state(s) to temperature control circuit 90 in the form of different levels, which in turn impels the magnetic valve 20. Dock detection circuit 130 provide docking states to dock control circuit 100 in the form of different levels which impels the magnetic valve accordingly to deal with different dock situations. Several miscellaneous sensors or switches such as lid switch 140, module detect 150, or IC mode detect 160, among others, can be input into a miscellaneous control circuit 110 in the form of different levels. The different levels correspond to respective changed states, which determine when to impel magnetic valve 20.

Also shown is a dock device 64, such as a docking station, which has an additional fan 62 which can be used to couple additional airflow across heat sink area 50, which is exposed when docked, depending on the power load of the electronic device 12 and the amount of heat detected in heat system 10.

Figure 2:
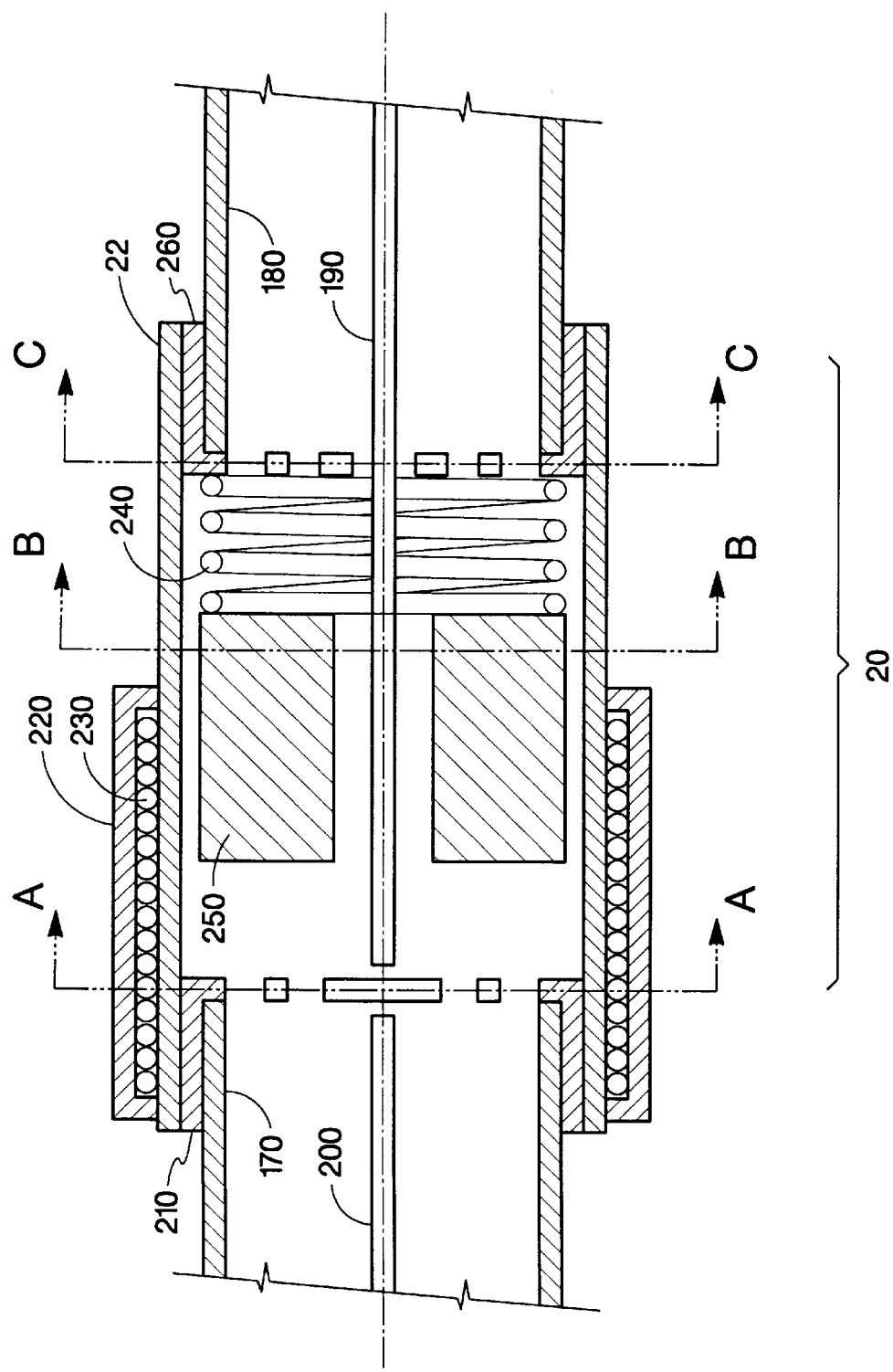
FIG. 2 illustrates the inner workings of the preferred embodiment of a heat pipe valve in a normally open configuration.

FIG. 2 illustrates the preferred embodiment's cross section of magnetic valve 20 and its coupling to a second heat pipe section 180 and a first heat pipe section 170. The magnetic valve 20 is comprised of a shell 22, which allows magnetic penetration through it, such as copper tubing that also provides excellent heat conduction. Surrounding the shell 22 is a coil 230 of wire which is wound preferably in a voice coil configuration to permit an electric current flowing through it to generate a magnetic field. The magnetic field may also be provided by an external magnetic material or other magnetic field producing device. When using a coil 230, the magnetic field can be enhanced or prevented from radiating far from magnetic valve 20, by using an optional field concentrator 220, preferably a ferrous shield. Inside of magnetic valve 20 is placed an actuator 250, which may be either magnetically attractive, such as a ferrite core, or magnetically polarized, such as a permanent magnet. A spring 240 is used to position the actuator 250, which is shown in FIG. 2 in a 'normally open' position. Actuator 250 has a hollow center or grooves on its peripheral surface to allow fluid in the magnetic valve 20 to pass by the valve. A first wick 200 allows fluid to move through first heat pipe section 170. A second screen 260 provides support for the spring 240 and is perforated with at least one aperture to allow fluid and optionally, a second wick 190 from second heat pipe section 180 to flow into the magnetic valve 20. When coil 230 is not activated the spring 240 retracts actuator 250 from a first screen 210 which has at least one aperture designed to allow fluid to flow when actuator 250 is not in contact with it. When coil 230 is activated, the magnetic field generated by the electronic current flowing through coil 230 impels actuator 250 to contact first screen 210 and thus block off the at least one aperture to prevent fluid from flowing from second heat pipe section 180 to first heat pipe section 170. Although the fluid flow in the heat pipe is restricted from flowing to the first heat pipe section 170, a small amount of heat might be transmitted through the metal shell. Another embodiment envisions that an insulator is placed between the valve and metal shell of the first heat pipe section 170 to reduce this heat leakage. Another embodiment to reduce heat leakage is to have first screen 210 made of an heat insulating material.

Although first wick 200 and second wick 190 are shown as being placed in the center of the heat pipe, other architectures for providing a wick or capillary force are known to those skilled in the art and could be used in place of that shown in the drawings and still fall within the spirit and scope of the invention.

It should be noted that actuator 250 and spring 240 should be oriented such that the spring 240 is in contact with the second screen 260, which contacts that heat pipe section attached to heat producing component 40. This selection of valve orientation prevents pressure built up in the heat pipe fluid from heat generated by heat producing component 40 from counteracting the spring compression force of spring 240 when closed and thereby cause a fluid leak in magnetic valve 20.

Figure 3A:
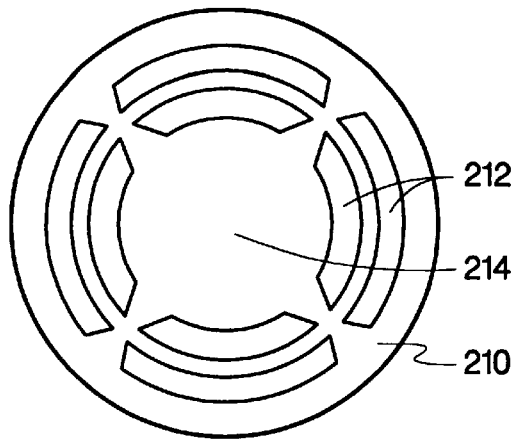
FIG. 3A shows the cross-sectional view taken from the AA section of FIG. 2.

FIG. 3A illustrates a view of the cross-section AA perspective of FIG. 2 of first screen 210. Aperture 212 provides openings for fluid flow and target 214 provides a stop.

Figure 3B:
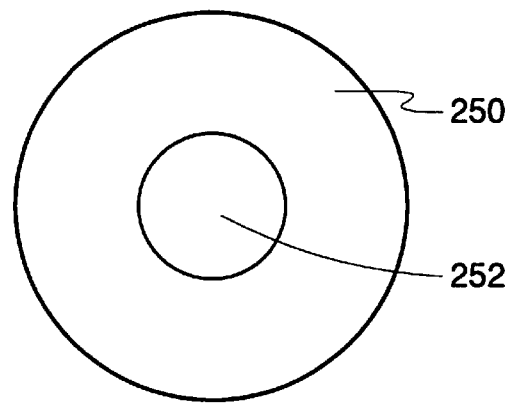
FIG. 3B shows the cross-sectional view taken from the BB section of FIG. 2.

FIG. 3B illustrates the cross-sectional view from the BB perspective of actuator 250, showing actuator aperture 252, which allows fluid flow through the actuator.

Figure 3C:
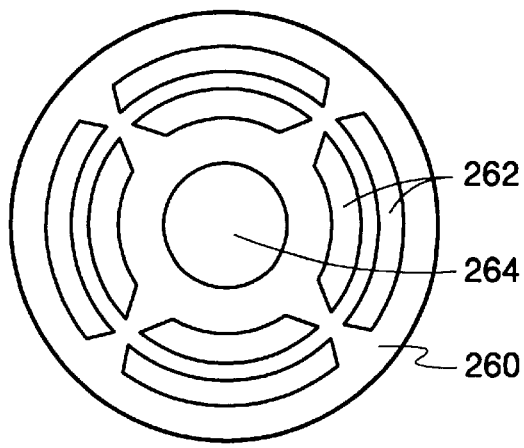
FIG. 3C shows the cross-sectional view taken from the CC section of FIG. 2.

FIG. 3C illustrates the cross-sectional view from the CC perspective of FIG. 2 of the second screen 260. Second screen 260 has aperture 262 and center aperture 264 that allows second wick 190 to enter the magnetic valve 20.

Those skilled in the art will appreciate that other aperture shapes are possible for the screens and actuator and still meet the spirit and scope of the invention.

Figure 4:
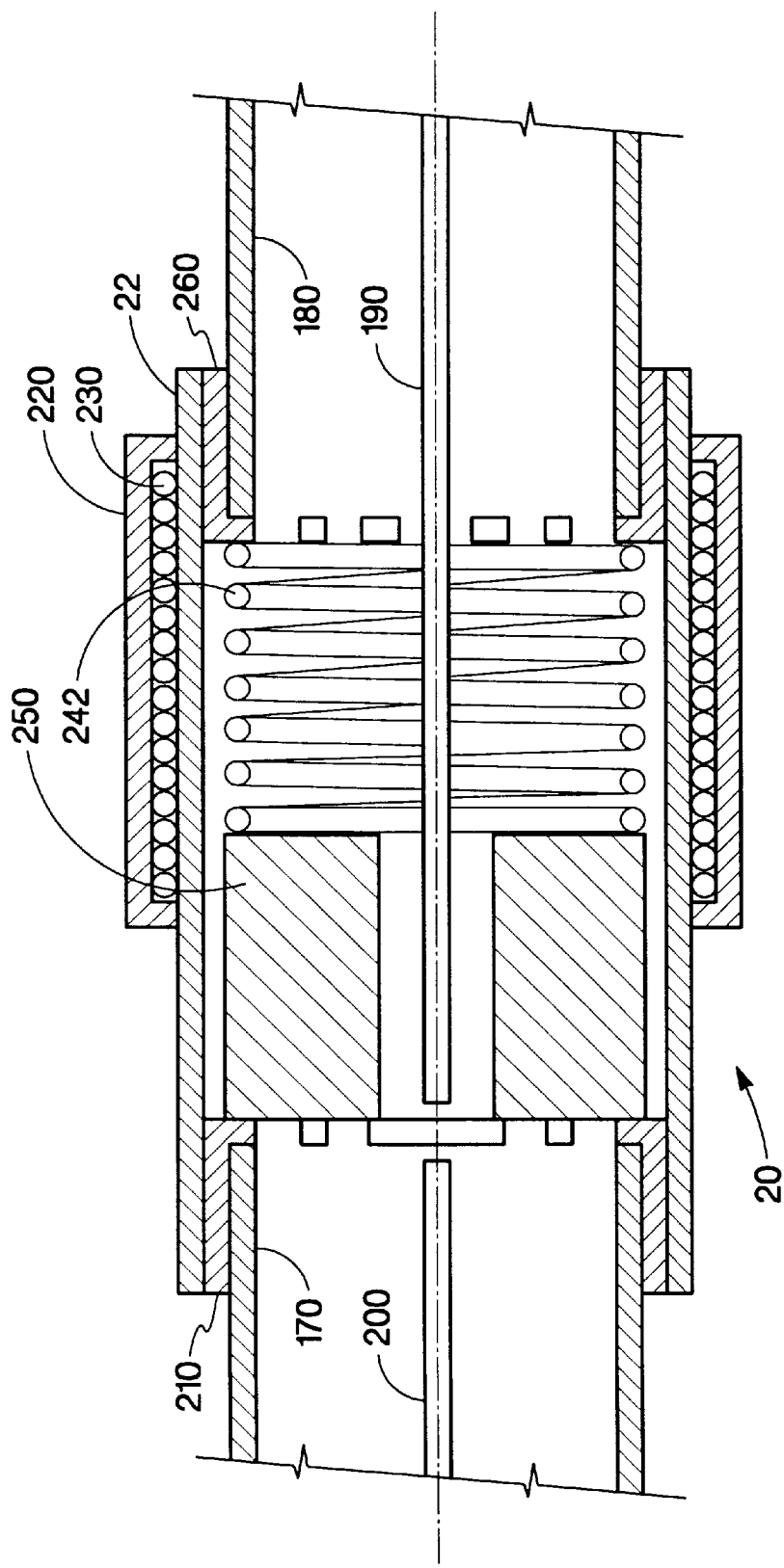
FIG. 4 illustrates the inner working of a first alternative embodiment of a heat pipe valve in a normally closed configuration.

FIG. 4 illustrates a first alternative embodiment of a normally closed valve 20 in which spring 242 is long enough to force actuator 250 up against first screen 210, effectively blocking the flow of fluid through the apertures in first screen 210. The coil 230 and field concentrator 220 are shifted over the spring 242 such that when coil 230 is activated, the magnetic field generated impels actuator 250 toward second screen 260 thereby compressing spring 242 and allowing fluid to flow through first screen 210.

Figure 5:
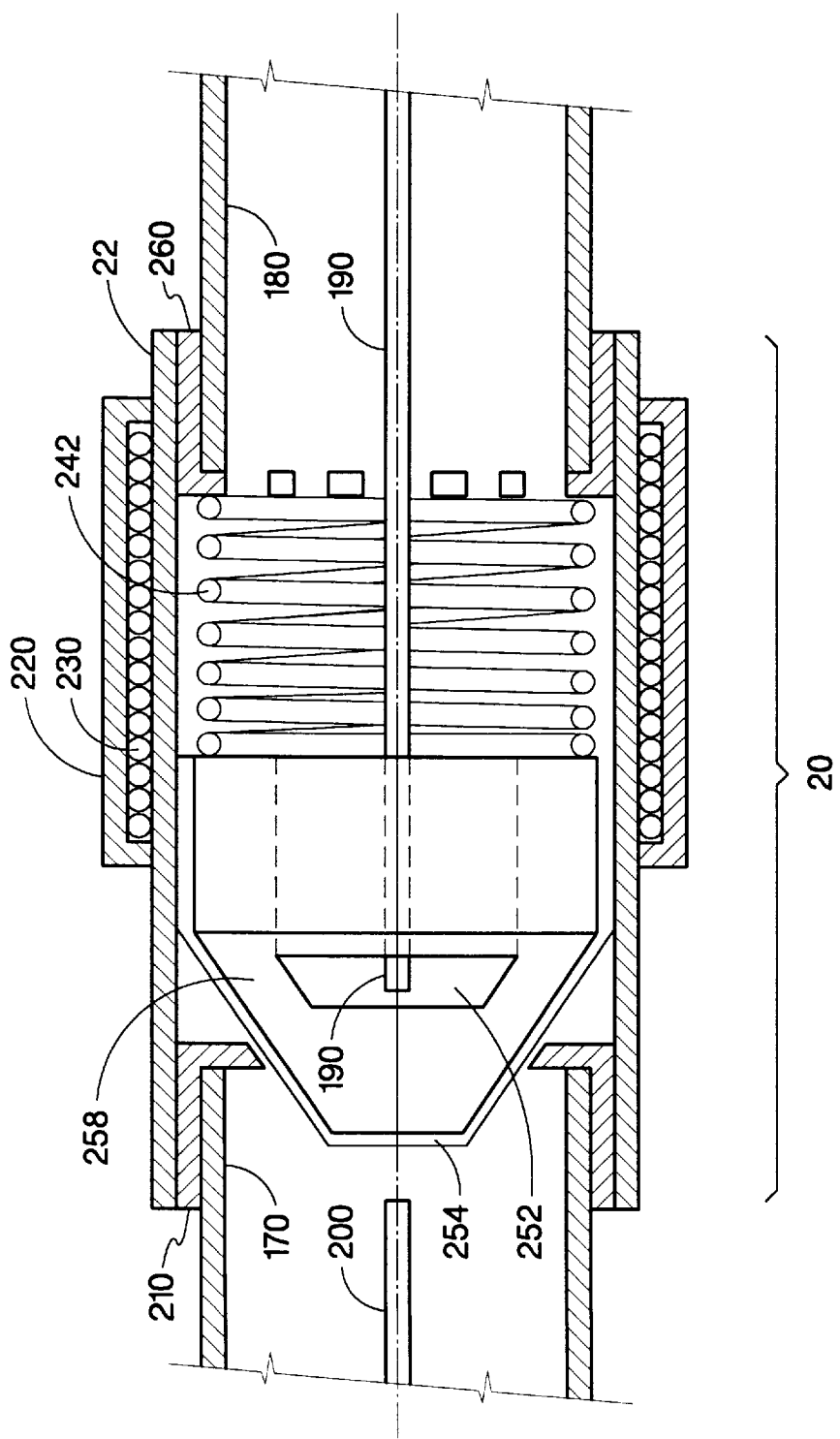
FIG. 5 illustrates the inner workings of a second alternative embodiment of a heat pipe valve in a normally closed configuration.

FIG. 5 illustrates a second alternative embodiment of valve 20 in which an actuator 258 is shaped to fit into the aperture of first screen 210 such that the amount of displacement of the actuator 258 from first screen 210 is proportional to the amount of electric current in coil 230 and the displacement of the actuator 258 controls the volume of fluid flow through first screen 210. This approach allows a controlled varied fluid flow that further refines the amount of heat transferred to first heat pipe section 170. An opening 252 in actuator 258 provides a fluid path through actuator 258. Optionally, to maintain tight control of fluid seepage around actuator 258, a lubricating film 254, preferably a Teflon lubricant like polytetrafluoroethylene (PTFE), is applied on the outside of actuator 258. Wick 190 can be placed in actuator 258 to help control the fluid flow from the second heat pipe section 180.

Figure 6:
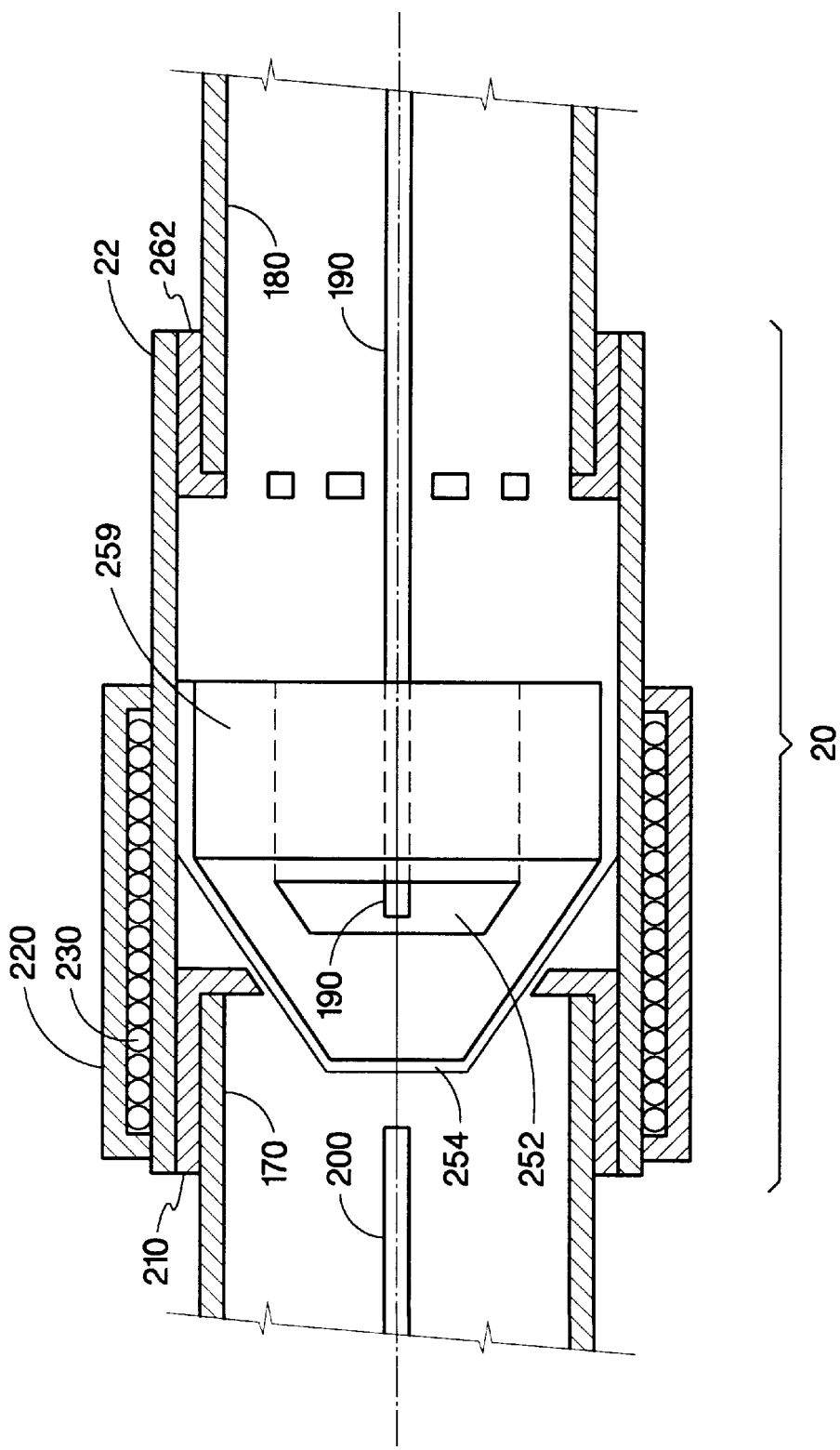
FIG. 6 illustrates the inner workings of a third alternative embodiment of a heat pipe valve which uses a magnetic actuator and a magnetically attractive screen.

FIG. 6 illustrates a third alternative embodiment of the invention in which actuator 259 is comprised of a magnetic material and a second screen 262 is comprised of a magnetically attractive material such as iron. In this instance, there is no need for a spring as actuator 259 returns to an open position upon deactivation of the magnetic field from coil 230, due to the actuator's magnetic attraction to second screen 262. A lubricating film 254, preferably PTFE, allows the actuator 259 to smoothly slide back and forth within the shell 22. Coil 230 and field concentrator 220 (if used) are positioned over first screen 210 to draw and impel actuator 259 towards first screen 210 when coil 230 is energized with electrical current to create a magnetic field.

Figure 7:
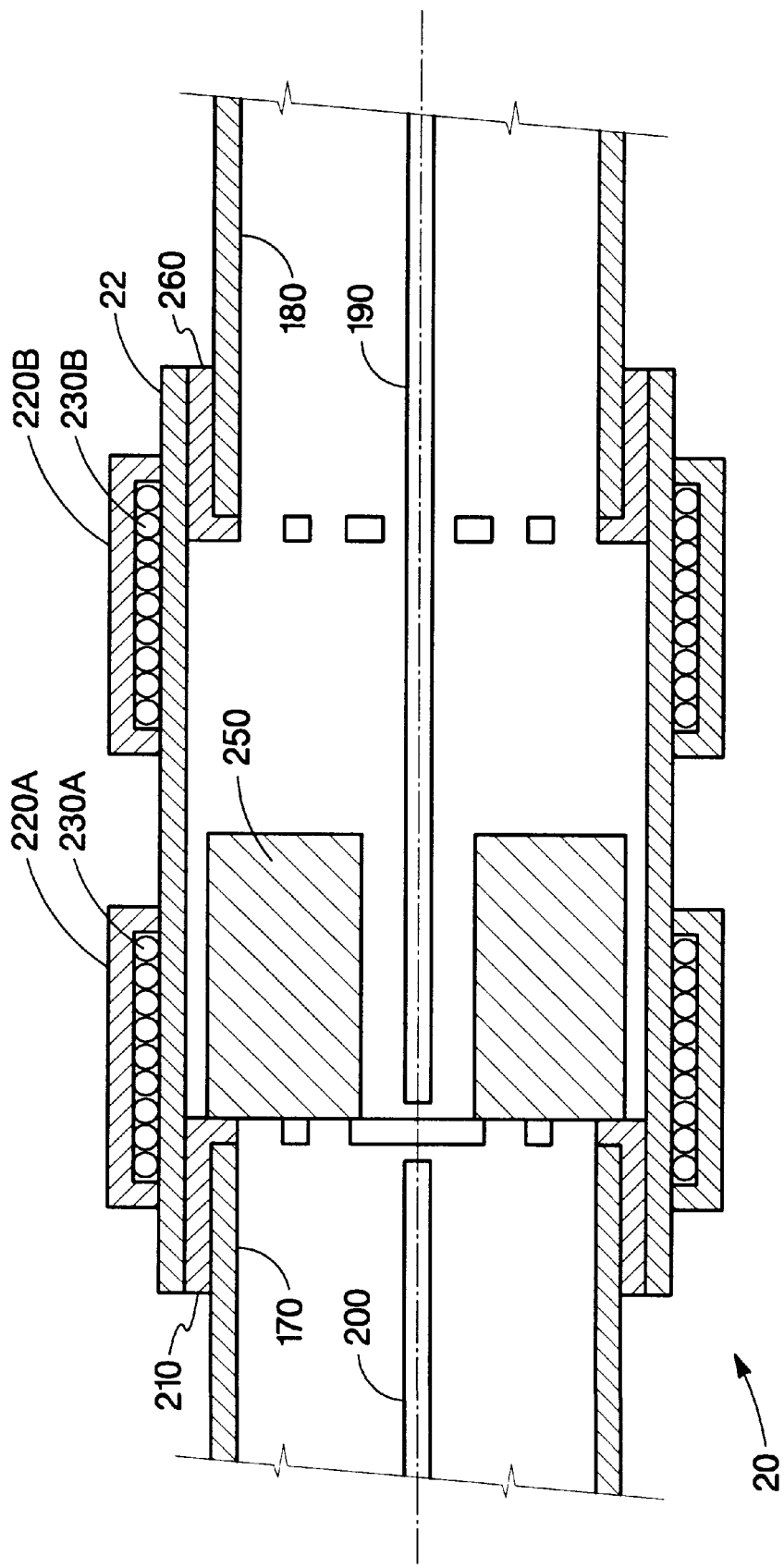
FIG. 7 illustrates the inner workings of a fourth alternative embodiment of a heat pipe valve which uses two coils to control the position of the actuator.

FIG. 7 illustrates a fourth alternative embodiment of the invention in which the actuator is comprised of either a magnetic material or magnetically attractive material. Two coils, a first coil 230A and a second coil 230B are used to each attract actuator 250, such that by activating either the first coil 230A or the second coil 230B, the valve is closed or opened, respectively. It is also envisioned in another embodiment that once the valve is closed by having first coil 230A activated and impelling actuator 250 to abut against first screen 210 and after a sufficient time for the vapor pressure in second heat pipe section 180 to build up, the electric current in first coil 230A can be reduced or shut-off and the valve held closed by the pressure in second heat pipe section 180. This reduction or shut-off of current into first coil 230A allows for reduced power consumption. As second heat pipe section 180 cools, either due to reduced power from heat producing component 40 or due to the effectiveness of fan 60 or dock fan 62 and heat sink area 50, the pressure on actuator 250 is reduced and vapor flows into the first heat pipe section 170. As the heat spreader 30 then warms, logic circuit 80 detects when to re-activate first coil 230A to close the heat pipe valve. The magnetic fields in first coil 230A and second coil 230B are optionally enhanced with a first field concentrator 220A and second field concentrator 220B, respectively. In another embodiment, it is envisioned that first coil 230A and second coil 230B are used to sense the location of actuator 250 before determining which coil to activate to impel actuator 250 to an open or closed position. This sensing is performed by detecting the change in inductance of the respective coil, which can be accomplished by various techniques known to those skilled in the art. By determining the position of actuator 250, if the electronic device 12 is jarred or moved, the valve could move out of position, be detected, and returned back to its proper state. It is also envisioned that the energizing current into the coils can optionally be pulsed to a higher level to overcome either initial friction or magnetic forces and then reduced to maintain the valve in an open or closed position. This variable pulsed energizing current technique allows for smaller coils thus reducing cost and saving space.

Figure 8:
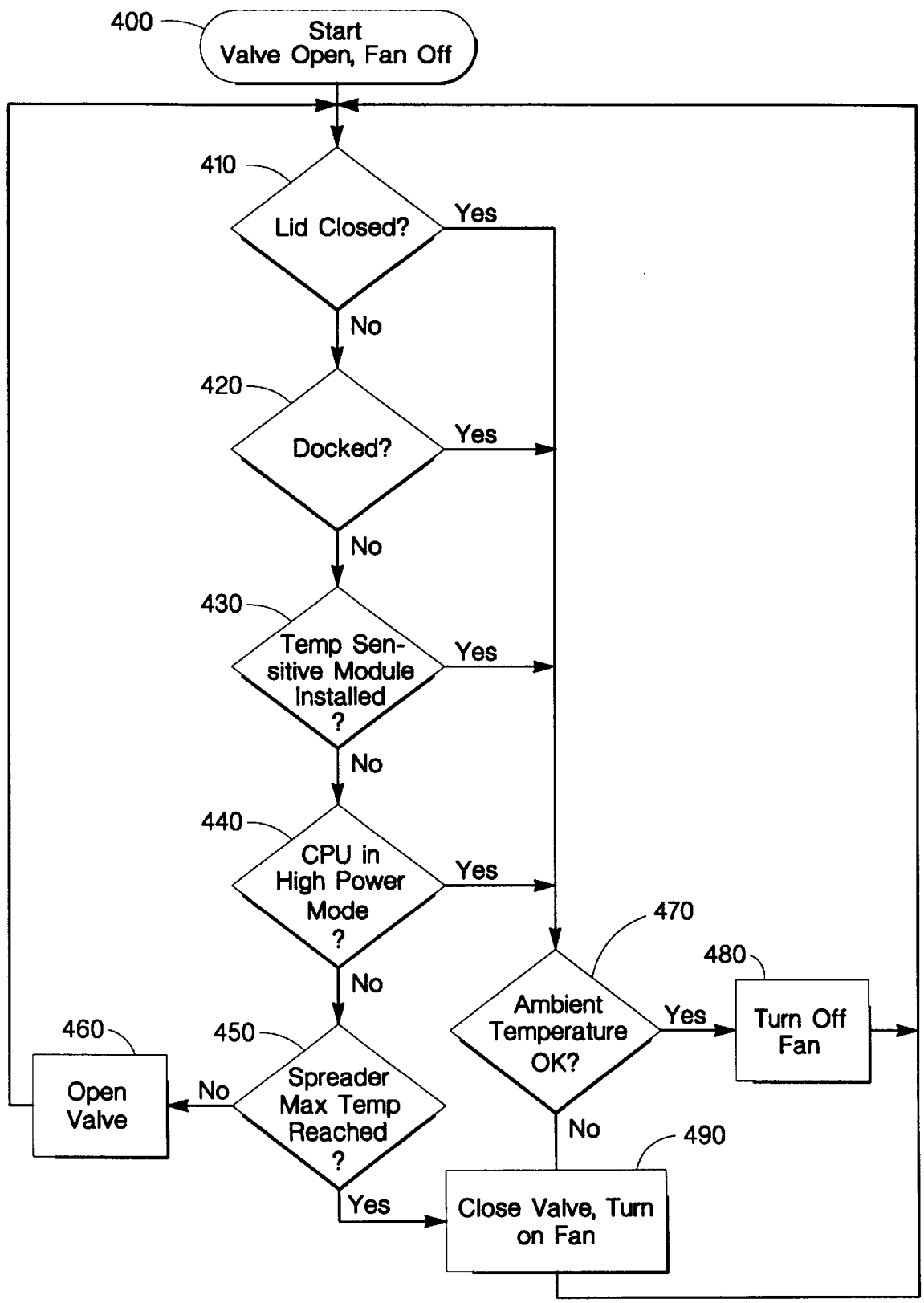
FIG. 8 is a flow chart of an exemplary embodiment of the logic used in logic circuit 80 to determine when to open/close the heat pipe valve and turn on/off the fan for a notebook computer.

FIG. 8 is a flow chart representing an exemplary embodiment of logic circuit 80 for an electronic device, such as a notebook computer, where the heat spreader is used as the primary heat dissipation and the heat sink area and fan used when either the heat spreader is overloaded or the electronic device is being used in a mode where the use of the heat spreader is undesirable, such as when the cover is closed. Start block 400 defines the initial state of the logic circuit 80, where a valve is initially open to allow the heat spreader to operate and the fan is off to conserve power . Logic circuit 80 checks miscellaneous control circuit 110 to determine if the lid is closed in decision block 410. If the lid is closed the logic proceeds to decision block 470 because the heat spreader will be unable to dissipate heat readily from the electronic device. Otherwise, logic circuit 80 checks dock control circuit 100 in decision block 420 to see if the electronic device 12 is docked. If docked, the electronic device receives power from an AC outlet and the fan can be used without regard to power dissipated from the fan so the logic proceeds to decision block 470. Otherwise, logic circuit 80 checks miscellaneous control circuit 110 in decision block 430 to see if a temperature sensitive module, like a battery or a peripheral such as a floppy drive, CD-ROM or DVD player, is installed in the electronic device. When a temperature sensitive module is installed, the heat spreader may cause it to become too warm so the logic proceeds to decision block 470. Otherwise, logic circuit 80 checks to see if the CPU (the heat producing component 40 in this example) is running in a high power mode in decision block 440. If so, the logic proceeds to decision block 470 because in this example the heat spreader will be unable to handle dissipating the heat from the CPU. Otherwise, logic circuit 80 checks temperature control circuit 90 to see if the heat spreader, 30 has reached its maximum operating temperature in decision block 450. If it has (perhaps from a combination of other factors such as graphics mode, memory operation, or PC cards), then the logic proceeds to decision block 490. Otherwise, the magnetic valve 20 is opened in block 460 to allow heat flow from component 40 (here represented as a CPU) to the heat spreader 30 and the logic begins checking at block 410 again.

Decision block 470 compares the ambient temperature in the electronic device to a preset temperature limit. If the preset temperature limit has been reached, block 490 enables the fan 60 to turn on and cool heat sink area 50 and block 490 closes the magnetic valve 20 and the logic proceeds back to start block 400. Otherwise, if the ambient temperature is O.K., the fan 60 is turned off in block 480 before proceeding back to the start block 400.

Those skilled in the art will appreciate that other logic implementations exist other than that shown in the exemplary embodiment to control the magnetic valve 20 and fan 60 and still fall within the scope and spirit of the invention. For example, alternative embodiments have been contemplated where different subsets of the decision blocks 410–440 are present. Indeed, one of these alternate embodiments eliminates all of the decision blocks 410–440 and 470–480, with start block 400 connected directly to block 450 and having block 490 only closing the valve.

What is claimed is:

1. A valve disposed in a heat pipe comprising:

a first screen having at least one aperture adjacent to first end of the heat pipe;

a second screen having at least one aperture adjacent to second end of the heat pipe;

a shell, said shell having a first end and a second end, said first end occluded with said first screen, said second end occluded with said second screen;

an actuator, said actuator having a first end, a second end and a cavity, said cavity allows a flow of fluid between said first end and said second end, said actuator formed to fit within said shell and said second end of said actuator shaped to seal said at least one aperture of said first screen; and at least one coil, said at least one coil producing a magnetic field in response to an electric current, said magnetic field penetrating said shell and said actuator attracted to said magnetic field.

2. The valve as in claim 1, further comprising a spring, said spring having a first end and a second end, said first end abutting said second screen, said first end of said actuator abutting said second end of said spring.

3. The valve as in claim 1, further comprising a field concentrator, said field concentrator circumscribing said coil whereby said field concentrator enhances said magnetic field within said shell.

4. The valve as in claim 1, wherein said second end of said actuator abuts and seals said at least one aperture of said first screen and retracts from said first screen in response to said magnetic field.

5. The valve as in claim 1, wherein said second end of said actuator abuts and seals said at least one aperture of said first screen in response to said magnetic field and retracts form said first screen when said magnetic field is not present.

6. The valve as in claim 1, wherein said second end of said actuator is shaped to fit inside of at least one aperture of said first screen and whereby the flow of fluid between said first end of said actuator and said second end of said actuator is proportional to the electric current supplied to said at least one coil.

7. The valve as in claim 1, wherein said actuator further comprises a lubricating material coated on its outer surface.

8. The valve as in claim 1, wherein said first screen further comprises a thermally isolating material.

* * * * *

UNITED STATES PATENT AND TRADEMARK OFFICE
CERTIFICATE OF CORRECTION

PATENT NO. : 6,167,955 B1  
DATED : January 2, 2001  
INVENTOR(S) : Van Brocklin et al.

Page 1 of 1

It is certified that error appears in the above-identified patent and that said Letters Patent is hereby corrected as shown below:

<u>Column 8,</u>  
Line 12, delete "form" and insert in lieu thereof -- from --.

Signed and Sealed this

Twenty-first Day of May, 2002

Attest:

*Attesting Officer*

JAMES E. ROGAN  
*Director of the United States Patent and Trademark Office*